(12) United States Patent
Boskamp et al.

(10) Patent No.: US 6,590,392 B2
(45) Date of Patent: Jul. 8, 2003

(54) SWITCHABLE FOV COIL ASSEMBLY HAVING END SADDLE COILS

(75) Inventors: Ed B. Boskamp, Menomonee Falls, WI (US); Daniel J. Weyers, Wauwatosa, WI (US)

(73) Assignee: GE Medical Systems Global Technology Co., LLC, Waukesha, WI (US)

(*) Notice: Subject to any disclaimer, the term of this patent is extended or adjusted under 35 U.S.C. 154(b) by 0 days.

(21) Appl. No.: 09/681,498

(22) Filed: Apr. 17, 2001

(65) Prior Publication Data
US 2002/0149367 A1 Oct. 17, 2002

(51) Int. Cl.$^7$ .................................................. G01V 3/00
(52) U.S. Cl. ........................ 324/318; 324/322; 324/307
(58) Field of Search ................................ 324/318, 322, 324/320, 309, 307

(56) References Cited
U.S. PATENT DOCUMENTS

| | | | |
|---|---|---|---|
| 4,835,472 A | * 5/1989 | Zabel et al. ................ | 324/318 |
| 4,996,481 A | * 2/1991 | Ackerman et al. .......... | 324/318 |
| 5,323,113 A | * 6/1994 | Cory et al. ................. | 324/318 |
| 5,689,187 A | * 11/1997 | Marek et al. ............... | 324/318 |
| 5,929,639 A | * 7/1999 | Doty .......................... | 324/318 |
| 6,487,436 B1 | * 11/2002 | Boskamp et al. .......... | 600/422 |

* cited by examiner

Primary Examiner—Diego Gutierrez
Assistant Examiner—Dixomara Vargas
(74) Attorney, Agent, or Firm—Ziolkowski Patent Solutions Group, LLC; Michael A. Della Penna; Carl B. Horton

(57) ABSTRACT

An MRI apparatus and method for minimizing mutual inductance between a center coil and an end coil configuration that reduces wrap-around artifacts in an MR image is provided. The switchable FOV coil configuration includes first and second RF coils aligned along a first axis. The second RF coil is coupled to the first RF coil to form a pair of end saddle coils. A central RF coil is also included having a length along the first axis and positioned at least partially within the end saddle coils such that activation of the central RF coil alone or in combination with the end saddle coils provides differing FOV's for imaging.

31 Claims, 5 Drawing Sheets

SWITCHABLE FOV COIL ASSEMBLY HAVING END SADDLE COILS

BACKGROUND OF INVENTION

The present invention relates generally to magnetic resonance imaging (MRI), and more particularly, to a switchable RF coil assembly and an end coil configuration together with a method to minimize the mutual inductance and occurrences of wrap-around artifacts in a whole-body imaging coil array When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed using gradient coils. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The transmission of a radio frequency (RF) excitation pulse through a subject and the reception of the resulting resonant signal is known in the art of nuclear magnetic resonance imaging. Examples of structures capable of transmitting and receiving RF pulses include a helical coil, saddle coil, resonant cavity, and a birdcage resonator or coil. While the use of these structures for transmission and reception of image signals has greatly improved reconstruction of an image, there are some drawbacks to these current designs. For example, such designs can result in the occurrence of what is commonly referred to as wrap-around artifacts that can create distortion during the image reconstruction process. That is, due to non-linear characteristics and an inhomogeneous background magnetic field $B_0$, there are areas outside the FOV that resonate at the same frequency as portions inside the FOV, such that these aliasing wrap-around artifacts can appear in the reconstructed image. These undesirable wrap-around artifacts cause a portion of the imaged subject, which is located outside the FOV, to appear inside of the FOV as part of the volume imaged.

The standard birdcage resonator and other known structures used for whole body imaging have limitations as to the strengths of magnetic fields introduced in the system because of their whole-body imaging methodology. Whole-body coils cause more irradiation of patient volume than equivalent shorter length coils. Irradiation levels are regulated according to an average specific power absorption rate (SAR) per unit mass for patients under examination. As a result, there is a need for an apparatus capable of operating with increased magnetic field strength without exceeding regulated absorption rates. The apparatus should also minimize mutual inductances within the coil configuration and reduce occurrences of wrap-around artifacts during image reconstruction.

It would therefore be desirable to have a switchable FOV coil configuration to restrict sensitivity in areas outside a FOV to reduce occurrences of wrap-around artifacts as compared to standard whole-body coil imaging devices and processes while minimizing the mutual inductance between coils of the configuration.

SUMMARY OF INVENTION

The present invention provides a switchable FOV magnetic resonance imaging coil configuration and method solving the aforementioned drawbacks.

The invention includes the use of a magnet to produce a magnetic field for MRI imaging of a patient. After the patient is placed within the bore of a magnet having a uniform static magnetic field such that nuclei within the patient are aligned, then excited and encoded using a set of linear magnetic field gradient coils, a FOV is selected by an operator and input into the computer. The computer then transmits signals for activation of a central RF coil only or the central RF coil in combination with first and second RF end coils to perform an imaging scan of the patient. During activation of the center RF coil only, the effective longitudinal length of the RF coil is less than a typical whole-body coil, thereby reducing wrap-around artifacts as compared to the standard length whole-body coil. A shorter RF coil causes limited excitation of nuclei in areas outside of the desired FOV. During activation of the coils in combination, the first and second RF end coils are aligned to form a pair of end coils reacting like a single resonator as opposed to independent end coils placed a certain distance apart.

In accordance with one aspect of the present invention, a switchable FOV coil configuration includes first and second RF coils aligned along a first axis. The second RF coil is coupled to the first RF coil to form an end coil configuration. This end coil configuration has at least one pair of RF coils, but can include more. The RF coil configuration is capable of switching between differing FOV sizes. The switchable FOV coil configuration also includes a central RF coil having a length along the first axis and positioned within the end coil configuration, preferably with some overlap. With activation of both the central RF coil and the end coil configuration, an imaging scan can be acquired that is comparable to a standard whole-body imaging scan.

In accordance with another aspect of the present invention, an MRI apparatus to acquire images is disclosed having an MRI system having a plurality of gradient coils positioned about a bore of a magnet to impress a polarizing magnetic field $B_0$ through a patient under examination. An RF transceiver system in an RF switch controlled by a pulse module is included to transmit RF signals to an RF coil assembly having a center coil and at least two pairs of interconnected semi-cylindrical coils to acquire magnetic resonance (MR) images of the patient. The MRI apparatus also includes a computer programmed to acquire a desired FOV size for imaging and activates a number of coils of the RF coil assembly in response to the desired FOV size. The computer also acquires data from the number of coils activated and reconstructs an image from the data acquired within the desired FOV In accordance with yet another aspect of the present invention, a technique of reducing mutual inductance in a switchable FOV MRI device includes the step of providing a first saddle coil and a second saddle coil having a common axis, wherein the first and second saddle coils are rotated relative to one another. Another step performed is positioning a center coil amid the first and second saddle coils. The technique also includes the step of providing a control connected to the center coil and the first and second saddle coils, wherein the control is configured to activate one of the center coil only, or the center coil and the first and second saddle coils simultaneously according to the desired FOV selected for imaging.

The invention also includes an RF end coil configuration that has first and second cylindrical coil elements electrically connected to one another and spaced a distance apart. Each cylindrical coil element has an upper and lower transceiver portion arranged opposite one another to form a center opening and are connected with a set of cross-over leads. The first and second cylindrical coils are positioned parallel to one another such that the center openings are in alignment to accommodate whole-body imaging. Preferably, a third coil element is fitted between the first and second coil elements of the RF end coil configuration and partially overlap the first and second cylindrical coil elements.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings.

DETAILED DESCRIPTION

Figure 1:
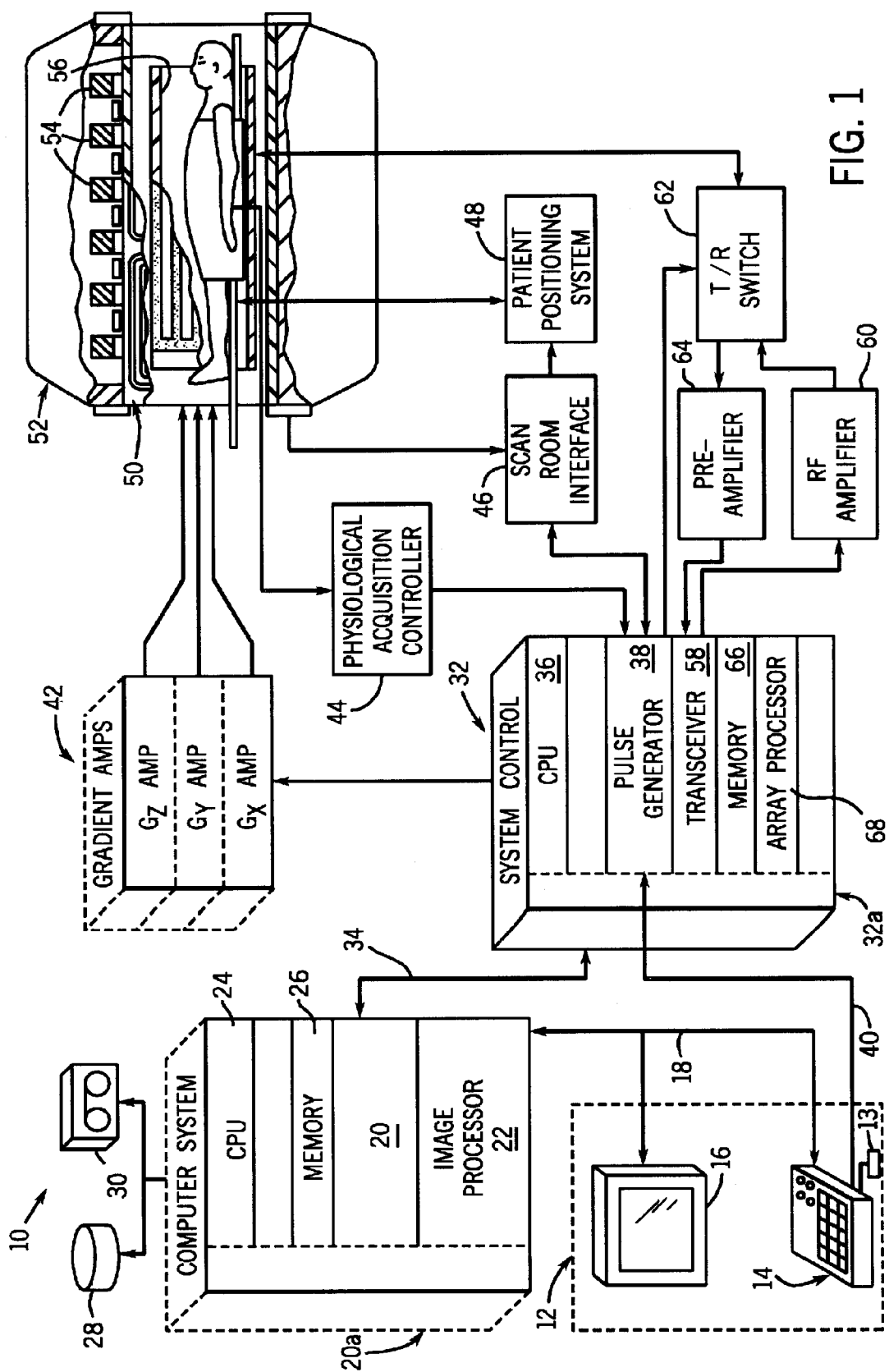
FIG. 1 is a block diagram of an MR system incorporating the present invention.

The embodiments of the present invention will now be described in more detail with reference to the accompanying drawings. Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 and RF shield (not shown) form a part of a magnet assembly 52 which includes a polarizing magnet 54 and a RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or a portion thereof and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
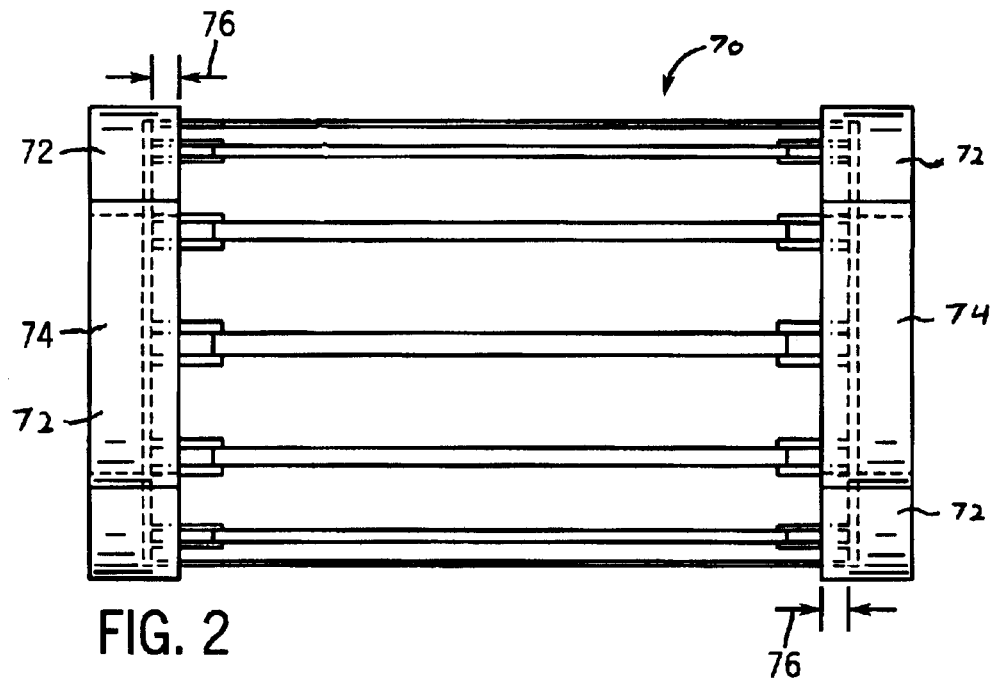
FIG. 2 is a side view of an RF coil assembly in accordance with the present invention.

Referring now to FIG. 2, a side view of a preferred embodiment of the RF coil assembly 56 is shown. A center birdcage coil or resonator 70 is sandwiched between a first RF coil 72 and a second RF coil 74. Such a coil configuration is particularly beneficial during whole-body MR imaging. The coil 70 is constructed in a ladder circuit configuration that closes upon itself. The current flow around the coil 70 is distributed sinusoidally. Further, the birdcage coil 70 is designed such that a phase shift is discreetly distributed around the circumference of the coil 70 from 0 to $2\pi$ (or $2\pi k$ where k is an integer). Preferably, the center birdcage coil 70 has simultaneous electrical sinusoidal and cosinusoidal waveform inputs upon energization of the coil 70 to generate a circular polarized RF magnetic field. In addition to birdcage coils or resonators, other coil arrays, for example helical coils, are contemplated for use with the present invention.

The first RF coil 72 and the second RF coil 74 have a saddle-like form. The second RF coil 74 is rotated ninety degrees with respect to the first RF coil 72. Each of the coils 70–74 are electrically disconnected from one another within the magnet assembly 52. Non-magnetic materials, such as plastic, can be used to house the coils 70–74 and maintain electrical separation. Upon activation of the coils 70–74, a uniform circularly polarized magnetic field is created within the RF coil assembly 56 causing spin excitation and encoding of nuclei.

The center birdcage coil 70 has a region of overlap 76 with the first RF coil 72 and the second RF coil 74 so as to reduce mutual inductance therebetween. Although the first RF coil 72 is shown overlapping the second RF coil 74, the reverse configuration is an equivalent alternative embodiment and is contemplated with this invention.

Figure 3:
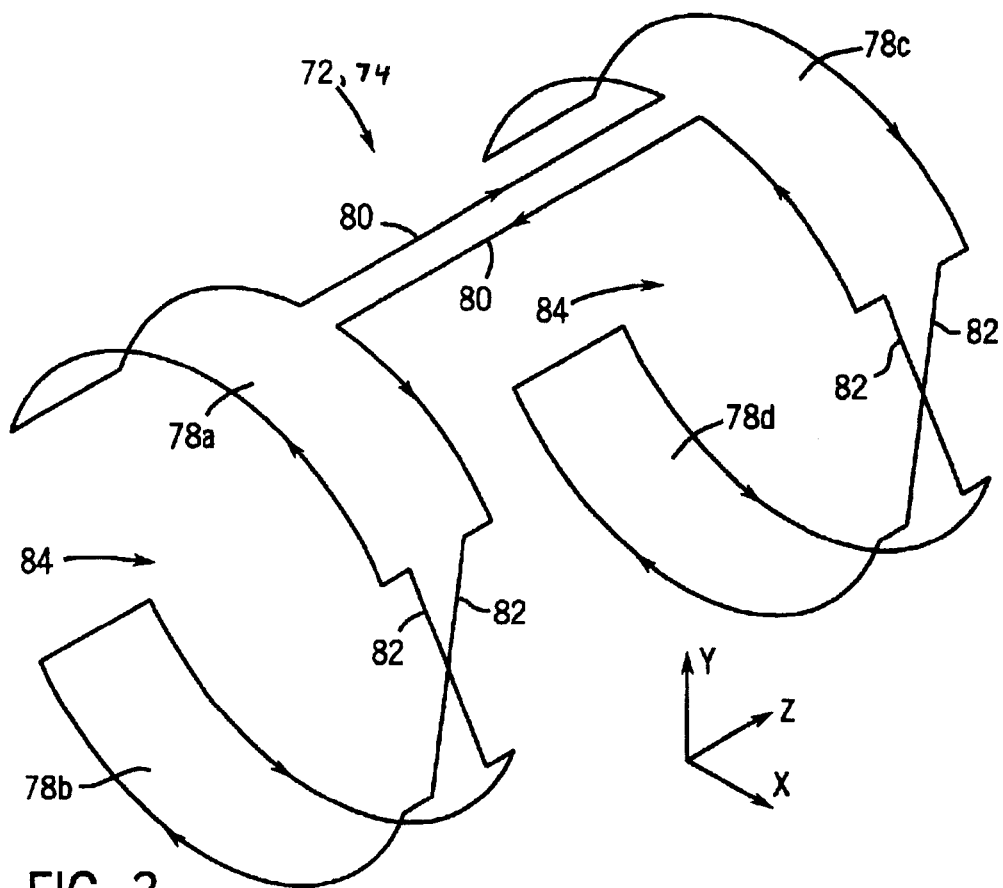
FIG. 3 is a perspective view of a portion of the RF coil assembly of FIG. 2.

FIG. 3 shows an elevated view of one embodiment of one RF coil 72, 74 having a saddle-like form. Each RF coil 72, 74 includes at least four interconnected semi-cylindrical coils 78a–d capable of transmitting and receiving signals. The transceiving coils 78a and 78c are interconnected with leads 80, for example copper wires, to connect semi-cylindrical coils located at opposed overlapping regions 76 of the central RF coil 70. Cross-over leads 82 connect semi-cylindrical coils 78a and 78b, and 78c and 78d, allowing a single power source to drive the end coil configuration 72, 74. The semi-cylindrical coils 78 in one embodiment are symmetrically opposed about the center coil 70 along a longitudinal axis. This end coil configuration is able to transmit signals by control 32 switching power to activate the semi-cylindrical coils 78a–d. At the regions of overlap 76, the first RF coil 72 and the second RF coil 74 combine to form the end coil configuration 84 which is generally aligned along a common longitudinal axis.

Figure 4:
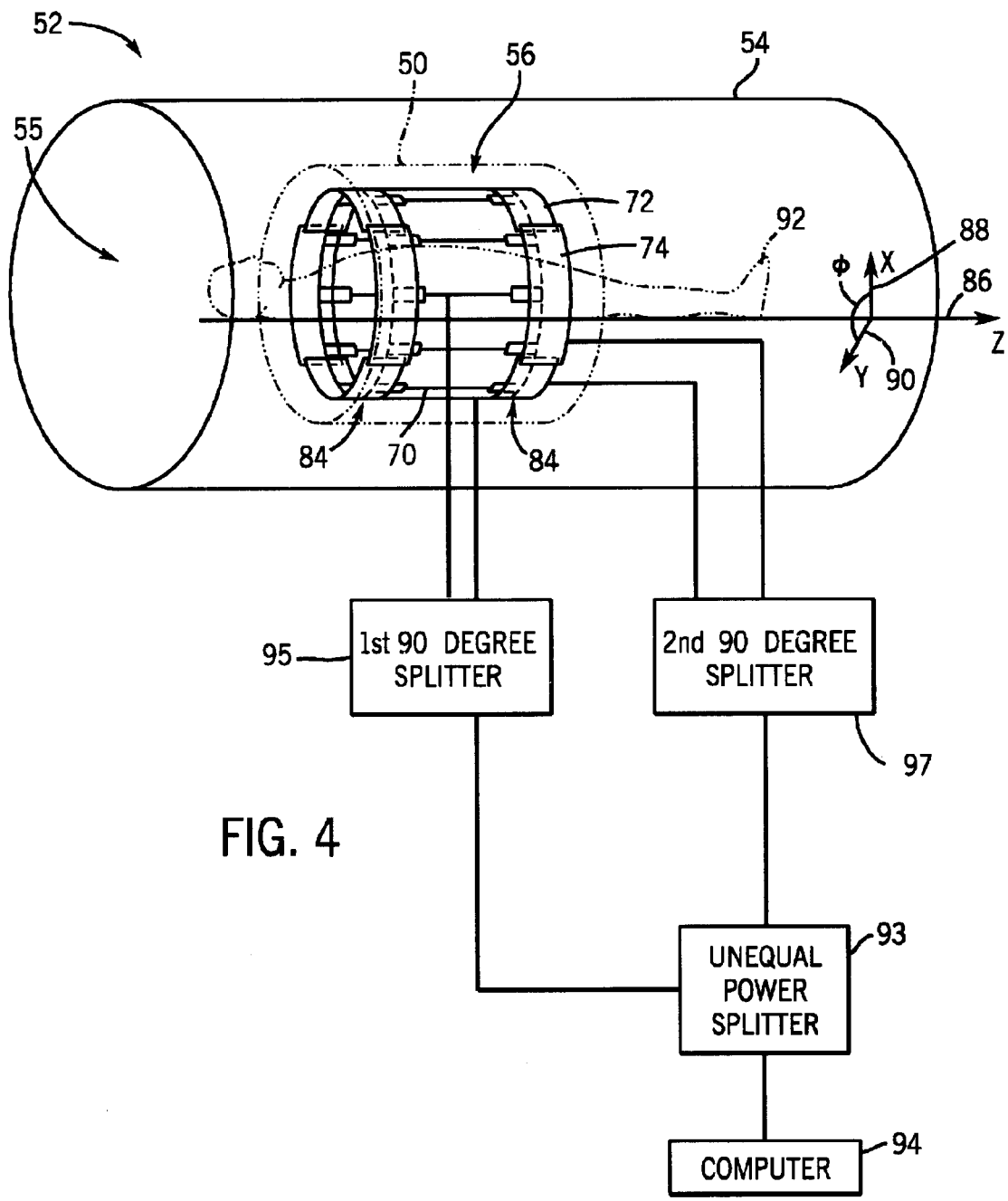
FIG. 4 is a schematic of the RF coil assembly of FIG. 2 connected to a block diagram representation of a control system in accordance with the present invention.

FIG. 4 shows one embodiment of the magnet assembly 52 of FIG. 1 in accordance with the present invention. The configuration of the magnetic assembly 52 includes a uniform cylindrical polarizing magnet 54 for generating the static magnetic field $B_0$ in its internal space 55. Disposed within the polarizing magnet 54 is the RF coil and shield assembly 56, and a gradient coil assembly 50, shown in phantom, comprised of one or more gradient coils. The RF coil assembly 56 has the first RF coil 72 and the second RF coil 74, forming the end coil configuration, and a generally cylindrical center coil 70, The configuration of semi-cylindrical coils 78 of the RF coils 72, 74 are configured such that coils 72, 74 behave as a single RF coil and can be driven by a single power source. Preferably, the end coils 84 overlap the center coil 70 by approximately 1 centimeter (1 cm) and are longitudinally shorter than the center coil 70, with a longitudinal length along a Z-axis 86 of approximately 12 cm. The diameters of the center coil 70 and end coils 84 as measured in the X-Y plane are substantially the same. The center coil 70 in a preferred embodiment has a longitudinal length of 42 centimeters. Preferably, the longitudinal length of the center coil 70 is less than a standard whole-body coil length of 64 cm. The center and end coils 70, 84 are configured to encode and excite nuclear spins situated within the uniform magnetic field $B_0$ in a switchable FOV based on an FOV size input. The polarizing magnet 54, gradient coils 50, center coil 70, and pair of end coils 84 are aligned along a common longitudinal center Z-axis 86 or first axis that is parallel to the homogenous static magnetic field $B_0$. X-axis 88 and Y-axis 90 define vertical and horizontal axes, respectively, for defining spatial positions of nuclei within the RF coil assembly 56 during the encoding process. Using the X, Y, and Z axes 86–90 as references, an azimuthal angle $\phi$, shown in FIG. 4, can vary from 0° to 360° and defines the angle of rotation between the first RF coil 72 and the second RF coil 74, but the preferred angle is 90° A patient 92, shown in phantom, is positioned within the RF coil assembly 56 such that the volume to be imaged within the field-of-view (FOV) is centered at the origin of the axes 86–90.

To control the switchable FOV coil configuration or RF coil assembly 56, in one embodiment, an unequal power splitter 93 is connected to the first RF coil 72 and the second RF coil 74 through a power splitter 97 so as to provide sine and cosine power to drive both coils. Additionally, the unequal power splitter 93 is similarly connected to the center coil 70 through a power splitter 95, generally having a length less than a standard whole-body RF coil, such that activation of the coils of the RF coil assembly 56 in unison generates a uniform magnetic field within the switchable FOV coil configuration. The unequal power splitter 93 is further connected to a computer 94 that includes operator console 12, computer system 20, disk storage 28, tape 30, control 32, physiological acquisition controller 44, scan room interface 46, patient positioning system 48, transmit/receive switch 62, and amplifiers 60, 64, as shown in FIG. 1. The computer 94 is designed to generate control signals, for larger FOV size inputs, that cause control 32 to switch power to the center coil 70 and the pair of end coils 84 in unison thereby generating a uniform amplitude magnetic field in the RF coil assembly 56. The computer 94 also causes outputs from the center coil 70 and/or the end coils 84 when the received FOV input is selected. If the center coil 70 and the end coils 84 are activated together, then the output is uniform and equal in the RF coil assembly 56.

Figure 5:
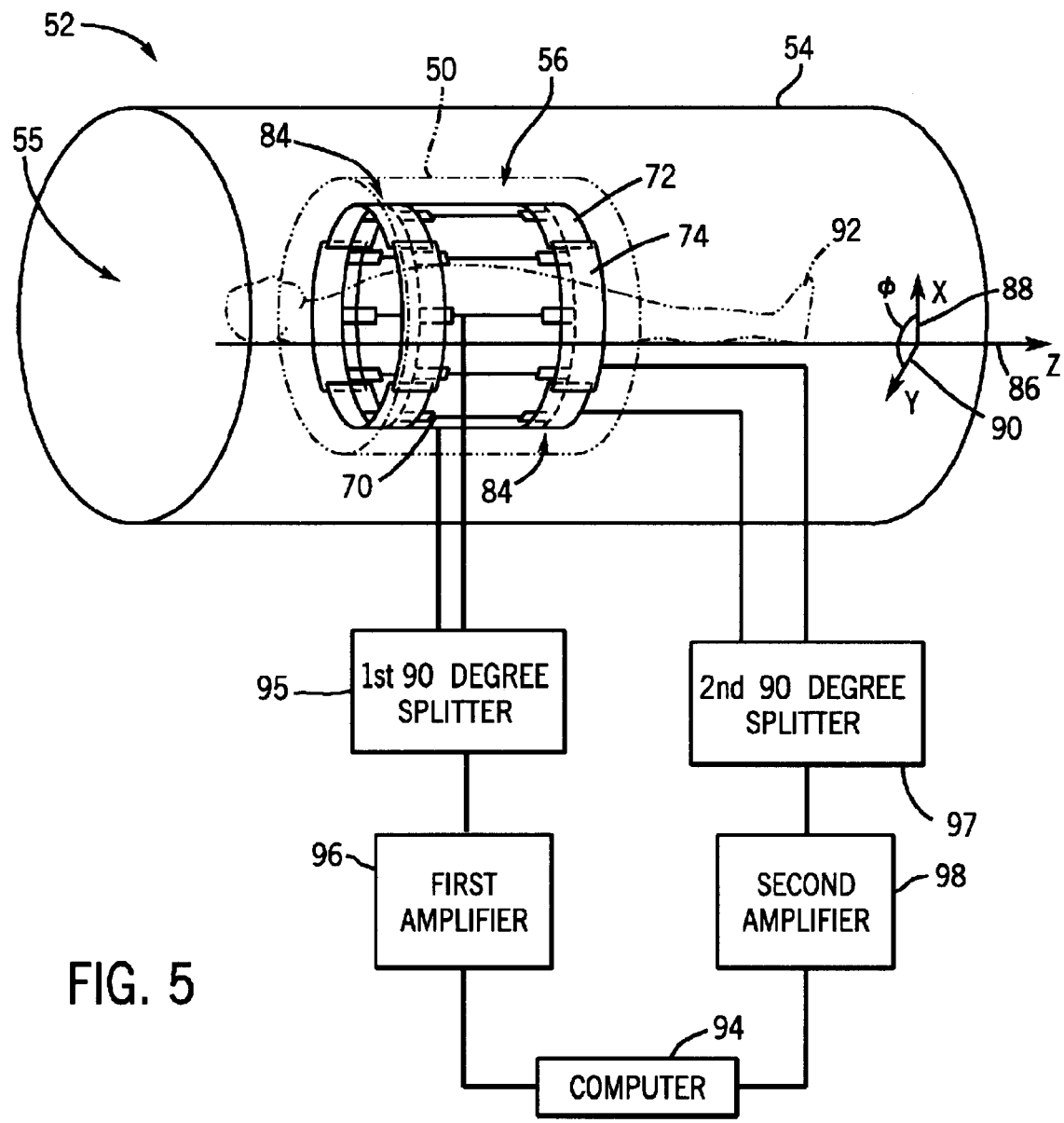
FIG. 5 is a schematic of another embodiment of the RF coil assembly of FIG. 2 connected to a block diagram representation of a control system in accordance with the present invention.

FIG. 5 shows another embodiment to control the RF coil assembly 56 shown in FIG. 1. The magnet assembly 52 and coil configuration 70, 84 are identical to that shown in FIG. 4. The center coil 70 is connected to a first amplifier that is connected to the computer 94 through a first power splitter 95. The first RF coil 72 and the second RF coil 74 are each connected to a second amplifier 98 that is also connected to the computer 94, but through a second power splitter 97. The first amplifier 96 and second amplifier 98 are capable of providing phase shifts between signals sent to their respective coils 70–74. The computer 94, upon simultaneous activation of the end coils 84 and the center coil 70 provides signals to generate a uniform magnetic field in the internal space 55 of RF coil assembly 56. Generally, since the end coils 84 are smaller than the center coil 70, less power is required to generate an equivalent magnetic field in the internal space 55 of the end coils 84 than that of the center coil 70.

The center coil 70 can be activated by computer 94 either alone or in unison with end coils 84 to transmit and/or receive RF signals. The transmitted signals are designed to obtain spatial spin data which is then processed by the computer 94 to reconstruct an image. The computer 94 can be programmed to acquire a set of data for image reconstruction that is limited to an imaging volume defined by the FOV input. Data acquisition includes slicing the FOV into sections and phase encoding the magnetic spins of the sliced sections to form an imaging space in memory of the computer 94. Thus, during reception of signals, the transverse magnetization of precessed nuclei are recorded and acquired by the selected receive coil, such as coils 70, 84 or a separate surface coil, as they precess in an X-Y plane defined by the X-Y axes 88, 90. In this manner, different imaging techniques can be used for image reconstruction.

In operation, a patient 92 is placed inside the coil assembly 56 by the patient positioning system 48 such that the region desired to be scanned is within a designated FOV centered at the origin of the coordinate system axes 86–90. The RF coil assembly 56 is configured to polarize, excite, and encode a set of spins in an imaging volume within the switchable FOV MRI device having at least two general FOV size designations. An FOV size designation is based on an FOV size input and is determined by an operator. In response, control 32 switches power to activate either the center coil 70 only, or center coil 70 in conjunction with the end coil configuration 84. Upon activation of the selected coils or resonators 70, 72, one or more RF signals or pulses are transmitted from the coils 70, 84 and then the coils can be switched to receive data, or a separate RF surface coil can be employed for data reception. The signals are then amplified 64 and processed by the control 32 to reconstruct an image of the subject 92 within the selected FOV, which can be displayed at 16. The unequal power splitter 93, or the first amplifier 96 and second amplifier 98, causes signals from the computer 94 to create a uniform magnetic field in the center coil 70 and the pair of end coils 84. Generally, whole-body imaging of a large FOV of a patient 92 is conducted by activating both the center coil 70 and the pair of end coils 84. Smaller FOV imaging scans are conducted by activating the center coil 70 only.

The activation of the center coil 70 only or in unison with the pair of end coils 84 provides a method for switching the FOV between a shorter and a longer FOV. Decreasing the center coil 70 size relative to a standard whole-body coil results in less wrap-around artifacts during image reconstruction and less irradiation when scanning a small FOV. Switching between the FOV's is controlled by system control 32 which passes commands for the desired coil activation via scan room interface 46 and/or the transmit/receive switch 62.

Figure 6:
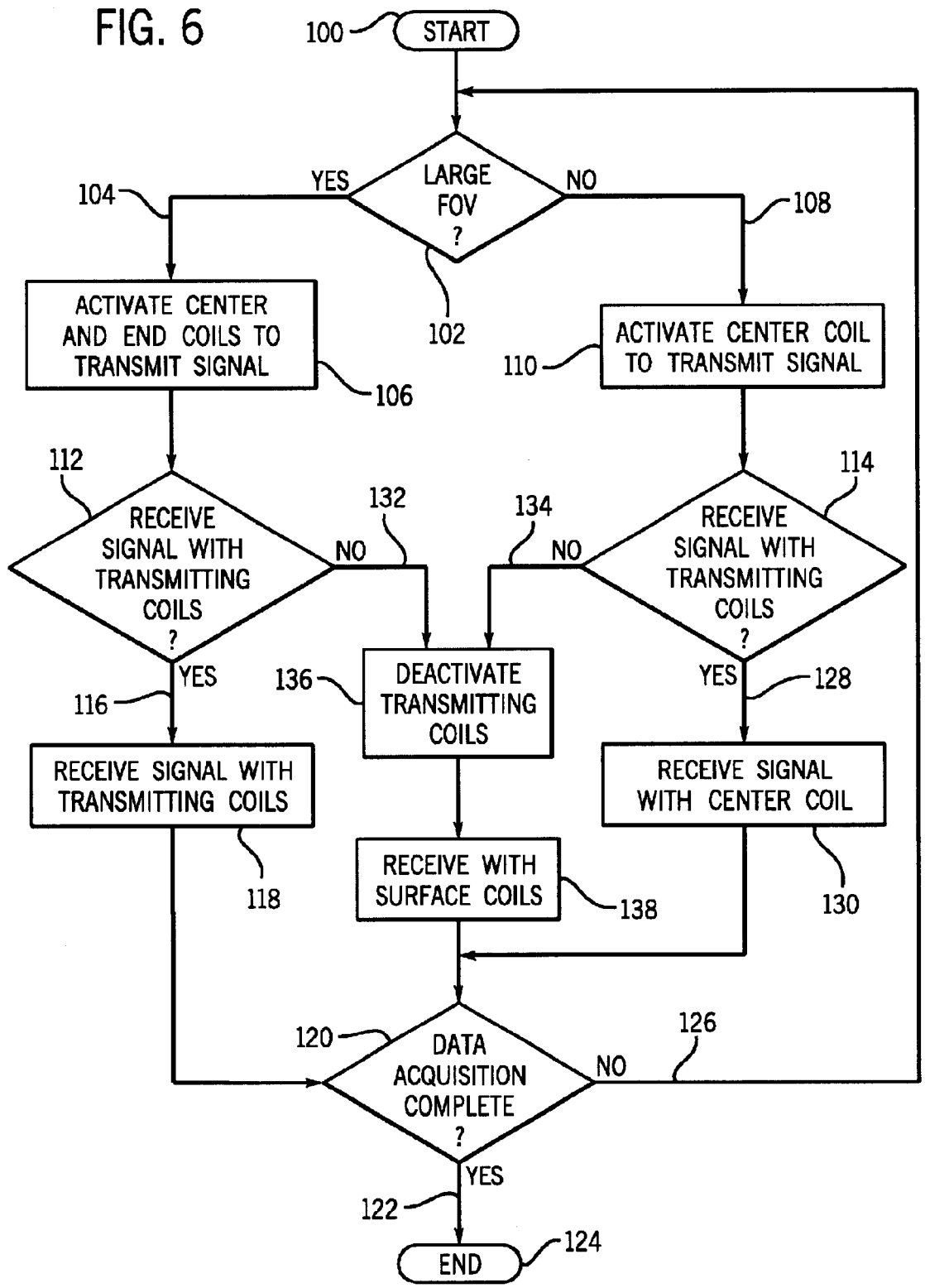
FIG. 6 is a flow chart showing a process to control the RF coil assembly of FIG. 2 and implemented in the system of FIG. 1.

Referring to FIG. 6, a technique of controlling an MRI device having a central RF coil and a pair of end RF coils is initiated at 100, and then a determination of the desired FOV size is made 102. If the size requested is large 104 (i.e., to cover the equivalent of a standard whole-body coil), the central RF coil and all end RF coils are activated 106 causing the transmission of a signal which passes through the patient and is received by the receiving coils, whether they are the same coils or a separate receiving coil. If the FOV size requested is not large 102, 108 then only the center coil is activated to transmit 110.

Both FOV designations 104, 108 independently decide whether to utilize their respective transmission coils 106, 110 as receiving coils 112, 114. Use of the transmitting coils as receiving coils for the large FOV 112, 116 results in signal reception at 118. The system then determines if data acquisition is complete 120, and if so 122, the process ends 124. If data acquisition is not complete 120, 126 then the technique loops back to step 102 and signal transmission occurs again. Likewise, if the transmitting coils are chosen to transmit and receive for an FOV designation that is something less than large 114, 128, then the center coil only can receive 130. Again the system determines if data acquisition is complete 120, and the technique either ends 124 or returns to step 102 causing a new transmission.

If the transmission coils are not selected as the receiving coils 132, 134, then the transmitting coils are deactivated 136. For the large FOV designation 104, both the central coil and the end coils are inactive. For the less than large FOV designation 108, only the center coil is deactivated since any end coils are already inactive. The transmitted signal is received with surface coils at 138 and then a determination is made on whether data acquisition is complete 120 similar to the previous determinations that used the transmitting coils as receiving coils.

In instances where an FOV has a longitudinal length greater than the length of the central RF coil, the method can be predetermined so as to automatically transmit and receive signals using both the central RF coil and the pair of end coils.

In accordance with one aspect of the present invention, a switchable FOV coil configuration includes an RF coil assembly having first and second RF coils aligned along a longitudinal axis, such as a Z-axis. The second RF coil is coupled to the first RF coil to form a pair of end saddle-like coils. The pair of end saddle-like coils have at least one pair of RF coils, but can include more. The RF coil configuration is capable of encoding and exciting spins of nuclei over a switchable FOV. The switchable FOV coil configuration also includes a central RF coil, for example a birdcage coil, having a length along the first axis and positioned at least partially, but preferably totally within the pair of end coils. With activation of both the central RF coil and the pair of end coils, an imaging scan can be acquired that is comparable to a standard whole-body imaging scan.

In accordance with another aspect of the present invention, an MRI apparatus to acquire images is disclosed having an MRI system having a plurality of gradient coils positioned about a bore of a magnet to impress a polarizing magnetic field $B_0$ through a patient under examination. An RF transceiver system in an RF switch controlled by a pulse module are included to transmit RF imaging signals to an RF coil assembly having a center coil and at least two pairs of interconnected saddle-like semi-cylindrical coils to acquire magnetic resonance (MR) images or data of the patient. A computer is further included and programmed to acquire a desired FOV size for imaging and activate a number of coils, such as the center coil only for certain axial image scans or all coils for a whole-body imaging scan. The computer also acquires data from the number of activated coils and reconstructs an image for the data acquired within the ddesired FO In accordance with yet another aspect of the present invention, a technique of reducing mutual inductance in a switchable FOV MRI device includes the steps of providing a first saddle coil and a second saddle coil having a common longitudinal axis, wherein the first and second saddle coils are rotated relative to one another by an angle φ. Preferably, φ=90°. The technique also positions a center coil amid the first and second saddle coils such that the mutual inductance between the center coil and saddle coils is minimized. The technique also includes providing a control connected to the center coil and the first and second saddle coils, wherein the control is configured to activate one of the center coil only, and the center coil and the first and second saddle coils simultaneously according to the desired FOV to be scanned.

Accordingly, the present invention also includes an RF end coil configuration that includes first and second cylindrical coil elements electrically connected to one another and spaced a distance apart. The cylindrical coil elements have upper and lower transceiver portions arranged opposite one another to form a center opening and are connected with a set of cross-over leads. The first and second cylindrical coils are positioned parallel to one another such that the center openings are in alignment. Preferably, the first and second coil elements are spaced apart a distance to allow insertion of a third coil element therebetween, the third coil element preferably being a birdcage coil.

The present invention has been described in terms of the preferred embodiment, and it is recognized that equivalents, alternatives, and modifications, aside from those expressly stated, are possible and within the scope of the appending claims.

What is claimed is:

1. A switchable FOV coil configuration comprising:
   a first RF coil having a center aligned along a longitudinal axis;
   a second RE coil having a center aligned along the longitudinal axis and coupled to the first RE coil to form an end coil configuration and
   a central RE birdcage coil having a length along the longitudinal axis and positioned within the end coil configuration.

2. The switchable FOV coil configuration of claim 1 wherein the first and second RF coils are each comprised of upper and lower semi-circular coils.

3. The switchable FOV coil configuration of claim 1 wherein the first and second RF coils are saddle coils and are rotated relative to one another.

4. The switchable FOV coil configuration of claim 3 wherein the longitudinal axis is a z-axis and the end coil configuration is characterized with respect to a cylindrical coordinate system having an azimuthal angle φ measured from a second axis such that a position of the first RF saddle coil includes approximately a φ=90° phase shift with respect to the second RF saddle coil.

5. The switchable FOV coil configuration of claim 1 further comprising:
   a control connected to the central RF coil and the first and second RF coils to switch between at least two FOV.

6. The switchable FOV coil configuration of claim 5 wherein the FOV is determined by an FOV input causing the control to provide power for activation of one of:
   the central RF coil for a small FOV input; and
   the central RF coil and the end coil configuration in unison for a large FOV input.

7. The switchable FOV coil configuration of claim 5 further comprising an unequal power splitter connected to the control, the first and second RF coils, and the central RF coil, such that upon activation of the central RF coil and the end coil configuration in unison generates a uniform amplitude magnetic field within the switchable FOV coil configuration.

8. The switchable FOV coil configuration of claim 1 wherein the central RE birdcage coil has a longitudinal length less than that of a standard whole-body RF coil.

9. The switchable FOV coil configuration of claim 1 wherein the central RF coil and the end coil configuration partially overlap one another so as to minimize mutual inductance between the center coil and the end coil configuration.

10. The switchable FOV coil configuration of claim 1 wherein the first and second RF coils comprise a number of coil sections, each having a semi-cylindrical shape.

11. The switchable FOV coil configuration of claim 10 wherein the number of coil sections arc symmetrically located about a cylindrical coil form.

12. The switchable EOV coil configuration of claim 1 further comprising:
   a control configured to generate control signals;
   a first amplifier connected to the central RE coil and the control;
   a second amplifier connected to the control and the end coil configuration; and
   wherein the control switches power to the central RF birdcage coil and a combination of the central RE coil and the end coil configuration to generate a uniform amplitude magnetic field in the switchable FOV coil configuration.

13. The switchable FOV coil configuration of claim 1 incorporated into an MR apparatus for MR imaging.

14. An MM apparatus to acquire images comprising:
   a magnetic resonance imaging (MIII) system having a plurality of gradient coils positioned about a bore of a magnet to impress a polarizing magnetic field and an RE transceiver system and an RE switch controlled by a pulse module to transmit RE signals to an RF coil assembly having a center birdcage coil and at least two pairs of interconnected semi-cylindrical coils; and
   a computer programmed to:
      acquire a desired FOV size for MR imaging;
      activate a number of coils of the RE coil assembly in response to the desired FOV size;
      acquire data from the number of coils activated; and
      reconstruct an image from data acquired within the desired FOV.

15. The MRI apparatus of claim 14 wherein the computer switches between at least two FOV's, to activate one of:
   the center coil only; and
   the center coil and the at least two pairs of interconnected semi-coils.

16. The MRI apparatus of claim 15 further comprising:
   an unequal power splitter connected to:
      the center coil;
      the computer;
      the at least two pair of interconnected semi-cylindrical coils; and
      wherein activating the center coil and the at least two pairs of interconnected semi-cylindrical coils together generates a uniform magnetic field across the desired FOV.

17. The MRI apparatus of claim 15 further comprising:
   a first amplifier connected to the center coil and the computer;
   a second amplifier connected to the computer and the at least two pair of interconnected semi-cylindrical coils; and
   wherein activating the center coil and the at least two pairs of interconnected semi-coils generates a uniform magnetic field in the desired FOV.

18. The MRI apparatus of claim 14 wherein the center coil is an RF birdcage resonator.

19. The MRI apparatus of claim 14 wherein the interconnected semi-cyclindrical coils are symmetrically disposed about the center coil.

20. The MRI apparatus of claim 14 wherein the semi-cylindrical coils partially overlap the center coil so as to minimize mutual inductance in the RF coil assembly.

21. A method of reducing mutual inductance in a switchable FOV MRI device comprising:
providing a first saddle coil and a second saddle coil having a common axis, the first and second saddle coils rotated relative to one another; and
positioning a center birdcage coil amid the first and second saddle coils, and wherein the position of the coils reduces the mutual inductance therebetween.

22. The method of claim 21 further comprising the steps of:
providing a control connected to the center coil and the first and second saddle coils, the control configured to activate one of:
the center coil only;
the center coil and the first and second saddle coils simultaneously; and
providing an unequal power source to energize the center coil and the first and second saddle coils in unison such that a uniform magnetic field is created within the switchable FOV MRI device.

23. The method of claim 21 wherein the center birdcage coil has a longitudinal length less than a standard MLII full-body RF coil.

24. The method of claim 21 wherein activation of the center coil, the first saddle coil, and the second saddle coil causes an RE image signal transmission for image reconstruction a large FOV and activation of the center coil only causes an RF image signal transmission for a small FOV.

25. The method of claim 24 further comprising the steps of creating a uniform circular polarized magnetic field within the center coil and the first and second saddle coils.

26. A switchable FOV device comprising:
means for defining a desired FOV size to be imaged;
means for transceiving RE signals over at least two desired FOV sizes;
means for switching the means for transceiving between the at least two desired FOV sizes to transmit RF signals from one of:
a center birdcage coil only; and
the center birdcage coil and a pair of saddle coils simultaneously;
means for acquiring MR data based on the desired FQV size;
means for reconstructing an image of the patient within the desired FOV size from the MR data.

27. The switchable FOV device of claim 26, wherein the means for transceiving includes one of transmitting and receiving signals using any one of the center birdcage coil only, a saddle coil configuration with the center birdcage coil, and a surface coil.

28. The switchable FOV device of claim 26, wherein the means for defining a desired FOV comprises at least two size designations of differing longitudinal lengths, and the means for switching switches power to activate one of:
a center coil only in the means for transceiving; and
the center coil and a pair of saddle coils simultaneously in the means for transceiving.

29. An RE coil configuration comprising:
a first coil having first and second cylindrical coil elements electrically connected to one another and spaced a distance apart, each cylindrical coil element having upper and lower transceiver portions arranged opposite one another to form a center opening and connected with a set of cross-over leads, the first and second cylindrical coils positioned parallel to one another such that the center openings are in alignment;
a second coil having first and second cylindrical coil elements electrically connected to one another and spaced a distance apart, each cylindrical coil element having upper and lower transceiver portions arranged opposite one another to fern a center opening and connected wit a set of cross-over leads, the first and second cylindrical coils positioned parallel to one another such that the center openings are in alignment; and
wherein the first and second coils are arranged coaxially and rotated with respect to one another.

30. The RF coil configuration of claim 29 wherein the first and second coil elements are spaced apart a distance to allow insertion of a third coil element therebetween.

31. The RF coil configuration of claim 30 wherein the third coil element is a birdcage coil configuration and wherein the first and second coil elements partially overlap the third coil element.

* * * * *

UNITED STATES PATENT AND TRADEMARK OFFICE
CERTIFICATE OF CORRECTION

PATENT NO.    : 6,590,392 B2
DATED         : July 8, 2003
INVENTOR(S)   : Boskamp et al.

It is certified that error appears in the above-identified patent and that said Letters Patent is hereby corrected as shown below:

Column 9,
Lines 26, 27, 29 and 63, delete "RE" and substitute therefore -- RF --;

Column 10,
Line 10, delete "EOV" and substitute therefore -- FOV --;
Lines 13 and 18, delete "RE" and substitute therefore -- RF --;
Line 24, delete "MM" and substitute therefore -- MRI --;
Line 25, delete "MIII" and substitute therefore -- MRI --;
Line 28, before the word "transceiver", delete "RE" and substitute therefore -- RF --;
Line 28, before the word "switch", delete "RE" and substitute therefore -- RF --;
Lines 29 and 34, delete "RE" and substitute therefore -- RF --;

Column 11,
Line 25, delete "MLII" and substitute therefore -- MRI --;
Lines 29 and 37, delete "RE" and substitute therefore -- RF --;

Column 12,
Line 1, delete "FQV" and substitute therefore -- FOV --;
Line 17, delete "RE" and substitute therefore -- RF --;
Line 30, delete the word "fern" and substitute therefore the word -- form --;
Line 31, delete the word "wit" and substitute therefore the word -- with --.

Signed and Sealed this

Twenty-eighth Day of October, 2003

JAMES E. ROGAN
*Director of the United States Patent and Trademark Office*